United States Patent
Cai et al.

(10) Patent No.: US 11,227,924 B2
(45) Date of Patent: Jan. 18, 2022

(54) DUAL BIT MEMORY DEVICE WITH TRIPLE GATE STRUCTURE

(71) Applicant: GLOBALFOUNDRIES Singapore Pte. Ltd., Singapore (SG)

(72) Inventors: Xinshu Cai, Singapore (SG); Shyue Seng Tan, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/741,769

(22) Filed: Jan. 14, 2020

(65) Prior Publication Data

US 2021/0217865 A1    Jul. 15, 2021

(51) Int. Cl.
| | | |
|---|---|---|
| *H01L 29/423* | (2006.01) | |
| *H01L 29/78* | (2006.01) | |
| *H01L 27/11521* | (2017.01) | |
| *H01L 29/788* | (2006.01) | |
| *H01L 29/66* | (2006.01) | |
| *G11C 16/26* | (2006.01) | |
| *H01L 21/28* | (2006.01) | |
| *G11C 16/04* | (2006.01) | |
| *G11C 16/10* | (2006.01) | |
| *G11C 16/14* | (2006.01) | |

(52) U.S. Cl.
CPC .... *H01L 29/42328* (2013.01); *G11C 16/0408* (2013.01); *G11C 16/10* (2013.01); *G11C 16/14* (2013.01); *G11C 16/26* (2013.01); *H01L 27/11521* (2013.01); *H01L 29/40114* (2019.08); *H01L 29/6656* (2013.01); *H01L 29/66795* (2013.01); *H01L 29/66825* (2013.01); *H01L 29/7851* (2013.01); *H01L 29/7884* (2013.01)

(58) Field of Classification Search
CPC ......... H01L 29/42328; H01L 29/66795; H01L 29/66825; H01L 29/6656; H01L 29/7851; H01L 27/11521; H01L 29/7884; H01L 29/40114; G11C 16/0408; G11C 16/26; G11C 16/10; G11C 16/14; G11C 16/0475
See application file for complete search history.

(56) References Cited

U.S. PATENT DOCUMENTS

| | | | |
|---|---|---|---|
| 5,714,412 A | 2/1998 | Liang et al. | |
| 9,812,460 B1 | 11/2017 | Wu et al. | |
| 2005/0157549 A1* | 7/2005 | Mokhlesi | H01L 29/513 365/185.01 |
| 2005/0260814 A1* | 11/2005 | Cho | H01L 29/66825 438/257 |

OTHER PUBLICATIONS

Wen Chao Shen et al., New High-Density Differential Split Gate Flash Memory With Self-Boosting Function, IEEE Electron Device Letters, Sep. 2013, 1127-1129, vol. 34, No. 9, IEEE, New Jersey, United States.
S. Tsuda et al., First Demonstration of FinFET Split-Gate MONOS for High-Speed and Highly-Reliable Embedded Flash in 16/14nm-node and beyond, 2016, 280-283, IEEE, New Jersey, United States.

* cited by examiner

*Primary Examiner* — Robert G Bachner
(74) *Attorney, Agent, or Firm* — David Cain

(57) ABSTRACT

A memory device is provided. The device comprises a semiconductor fin with a first gate and a second gate disposed over the semiconductor fin. A third gate is positioned over the semiconductor fin and a lower portion of the third gate is disposed between the first and second gates.

20 Claims, 9 Drawing Sheets

View X-X'

View X-X'

View X-X'

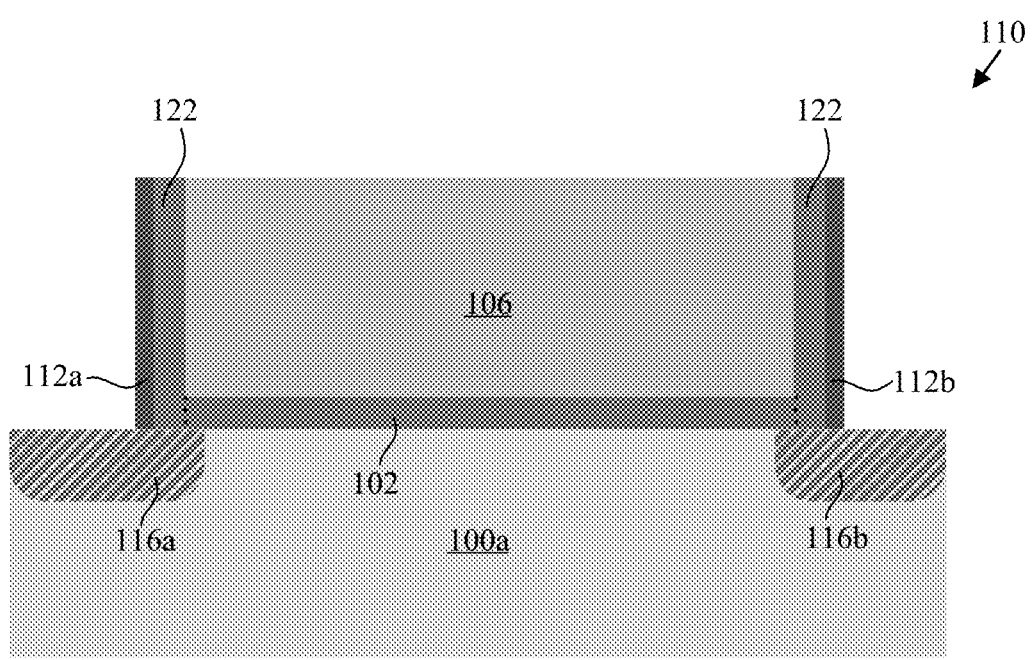
FIG. 3A      View X-X'

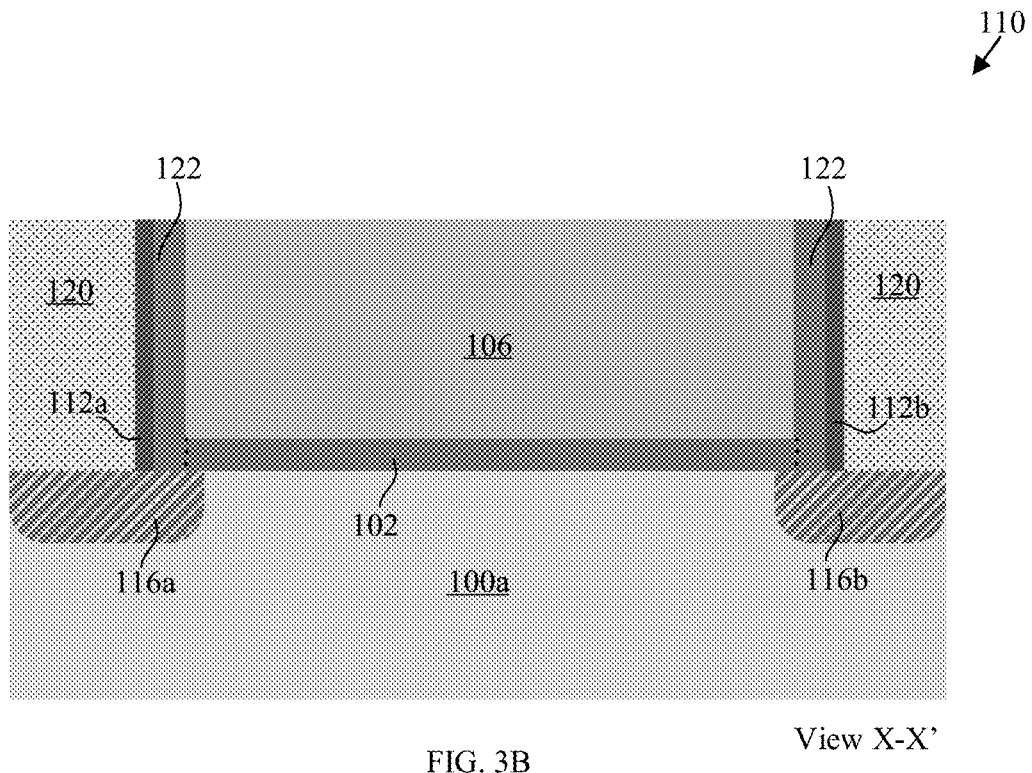
FIG. 3B  View X-X'
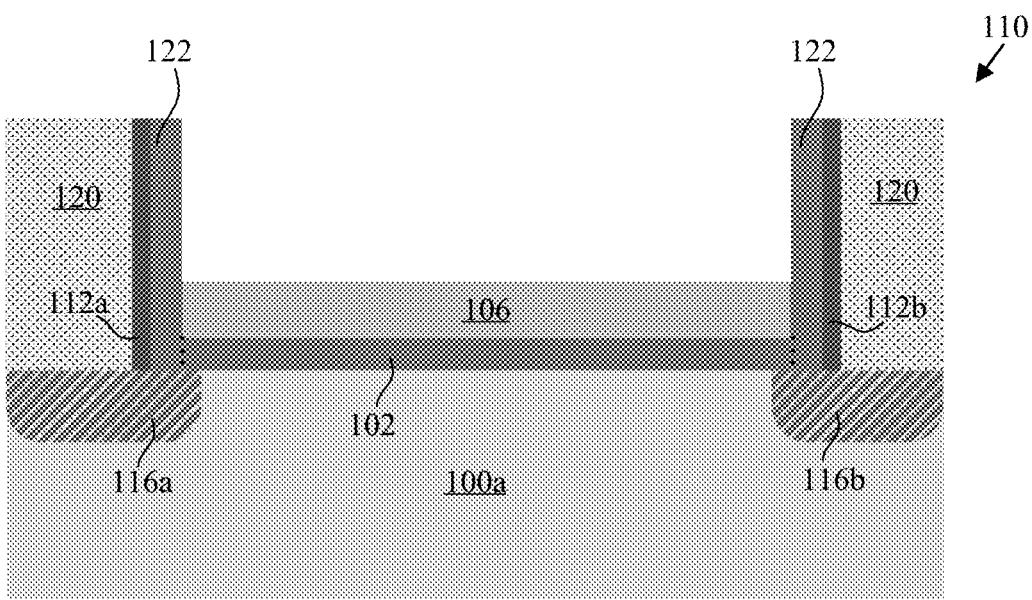
FIG. 3C  View X-X'

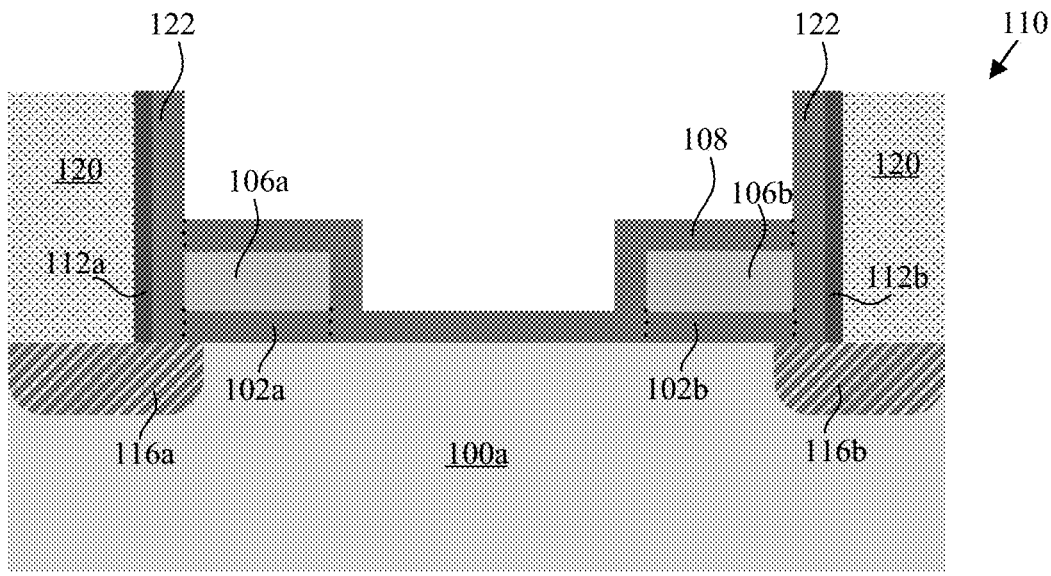
FIG. 3D  View X-X'
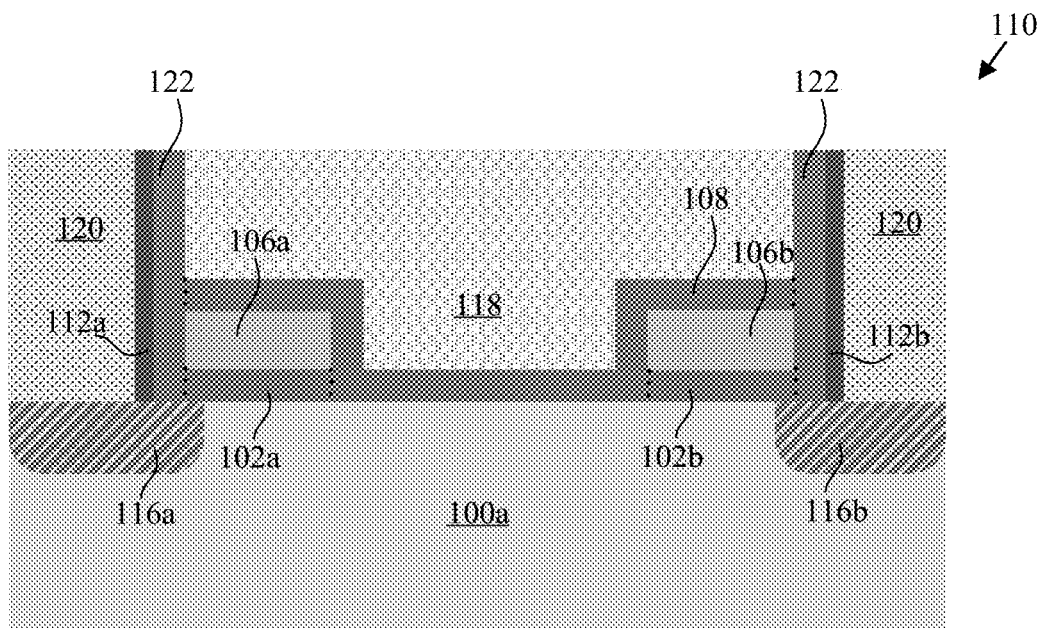
FIG. 3E  View X-X'

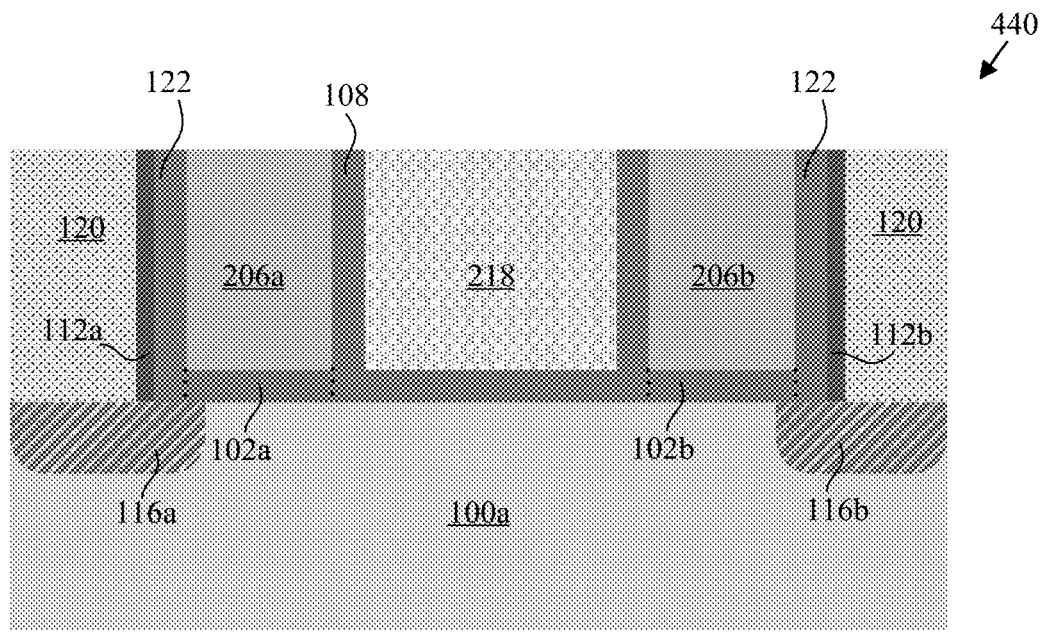
FIG. 4   View X-X'
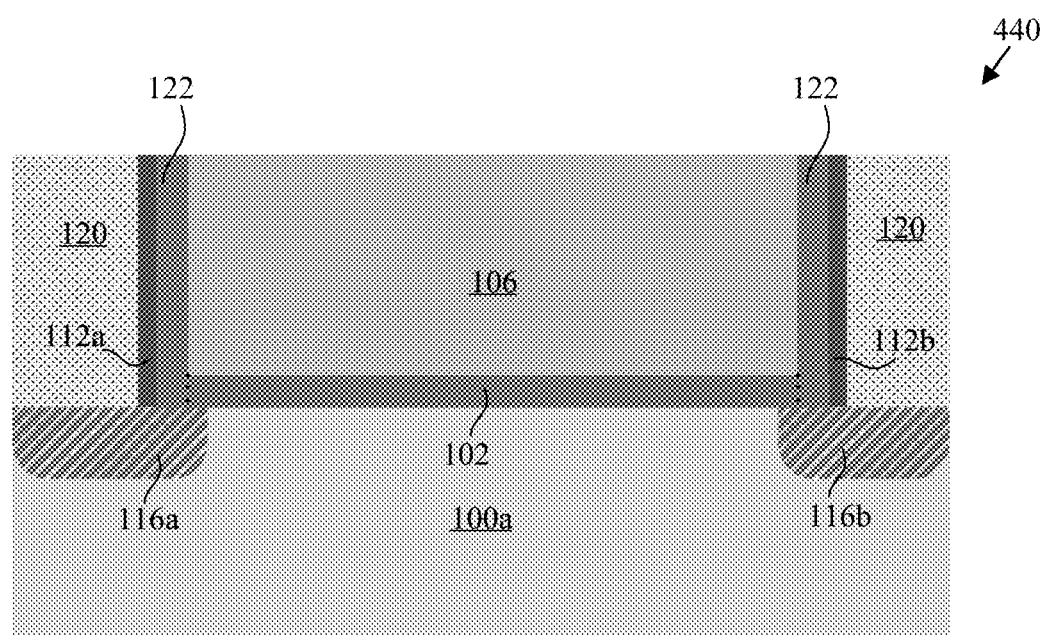
FIG. 5A   View X-X'

View X-X'

View X-X'

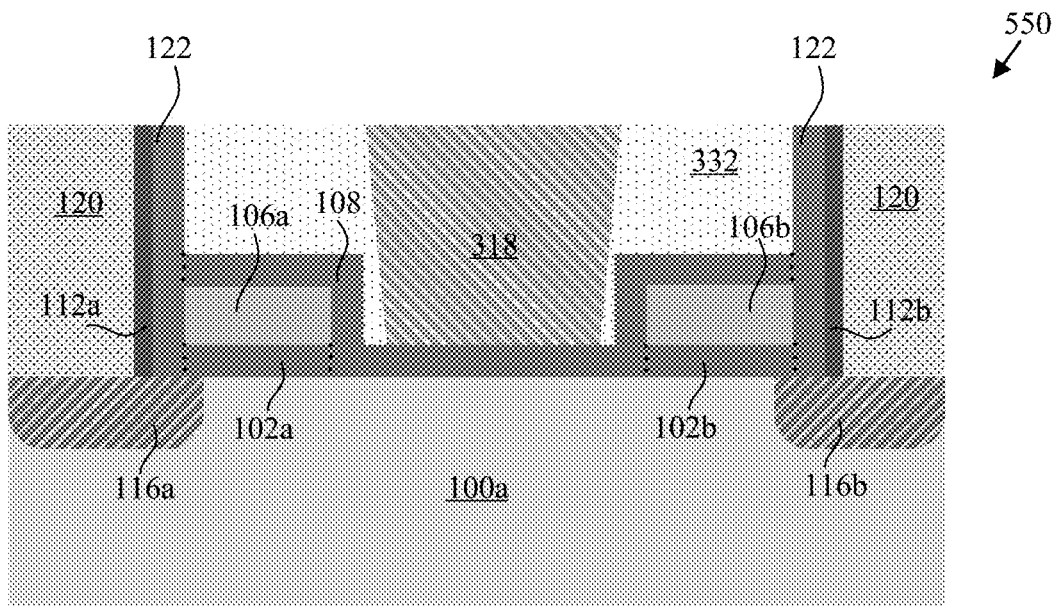
FIG. 6  View X-X'
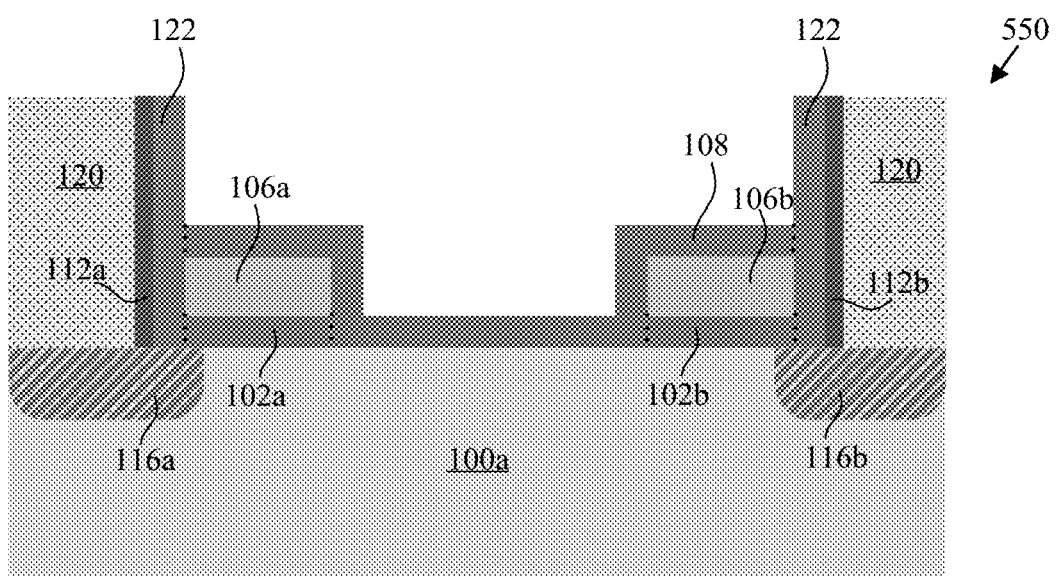
FIG. 7A  View X-X'

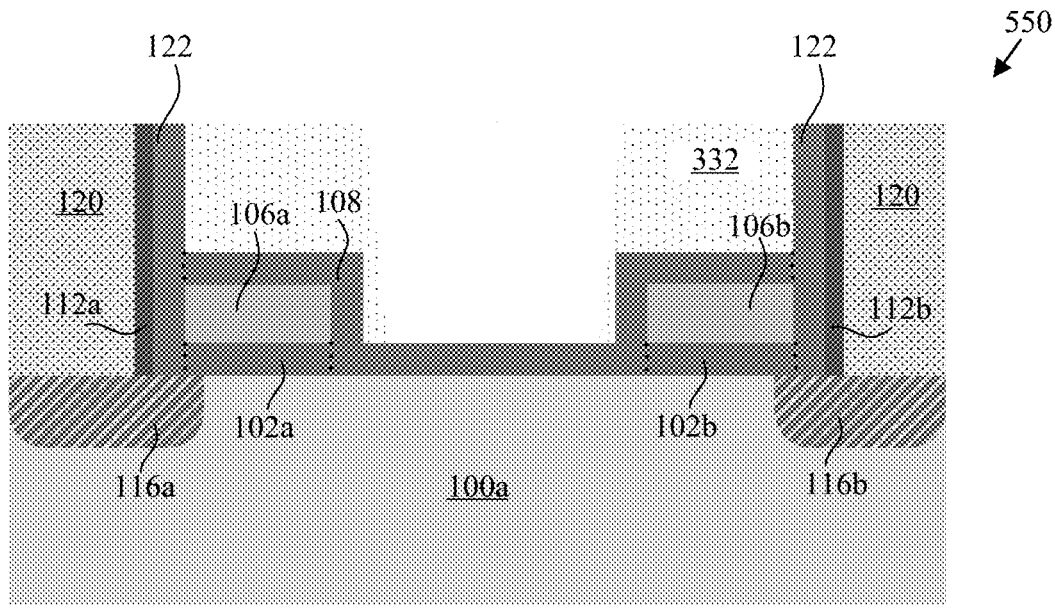
FIG. 7B  View X-X'
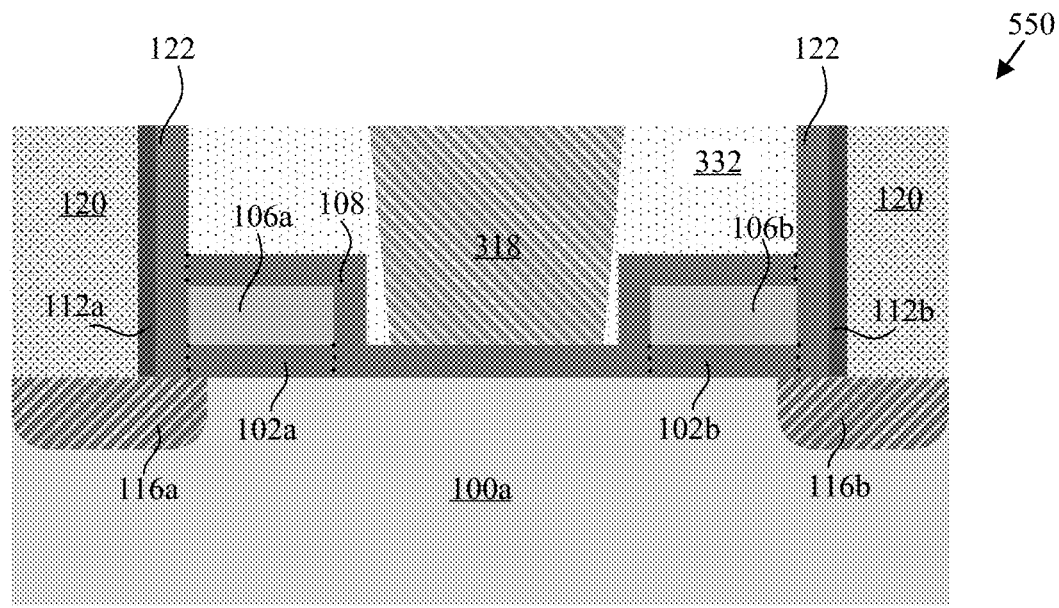
FIG. 7C  View X-X'

DUAL BIT MEMORY DEVICE WITH TRIPLE GATE STRUCTURE

FIELD OF THE INVENTION

The disclosed embodiments relate generally to semiconductor memory devices, and more particularly, to nonvolatile memory devices with higher integration density, faster speed and simpler fabrication process.

BACKGROUND

A nonvolatile memory device retains stored data even if power is turned off. Electrically erasable programmable read only memory (EEPROM) and Flash EEPROM are some of the currently available nonvolatile memories. One example of an EEPROM device is an Embedded Flash (e-Flash) memory. E-Flash memory devices are non-removable Flash memory that is used for storage in automotive applications and portable devices such as cellphones and tablets.

Current memory architecture utilizes a floating gate and a control gate. The control gate is stacked above the floating gate. Source and drain regions are positioned adjacent to opposite sides of the floating gate.

To program the device, a bias is applied to the control gate and the drain of a memory device resulting in injection of electrons by hot electron injection to the floating gate. To erase the device, a bias applied to the control gate expels charges from the floating gate.

The current memory architecture has a low integration density, high resistance and slow program and erase speed. Other emerging nonvolatile memory structures to be used in advanced technology nodes with metal gate processes from 28 nm down to 7 nm such as magnetic random access memory (MRAM), phase change memory (PCM) and resistive random access memory (RRAM) are unable to meet the high temperature requirements in automotive applications. Thus, there is an urgent need for an improved memory device structure to overcome the challenges mentioned above.

SUMMARY

In an aspect of the present disclosure, a memory device is provided. The device comprises a semiconductor fin with a first gate and a second gate disposed over the semiconductor fin. A third gate is positioned over the semiconductor fin. A lower portion of the third gate is disposed between the first and second gates.

In another aspect of the present disclosure, a memory device is provided. The device comprises a dielectric layer with a semiconductor fin. A bottom portion of the semiconductor fin is surrounded by the dielectric layer. A first gate and a second gate are disposed over the semiconductor fin. A third gate is positioned over the semiconductor fin. A lower portion of the third gate is disposed between the first and second gates.

In yet another aspect of the present disclosure, a method of fabricating a memory device is provided. The method comprises providing a semiconductor fin and forming a first gate and a second gate over the semiconductor fin. A third gate is formed over the semiconductor fin. A lower portion of the third gate is between the first and second gates.

Numerous advantages may be derived from the embodiments described below. The memory device is a dual bit memory device comprising a semiconductor fin with a triple gate structure i.e., having three gates disposed over the semiconductor fin. The dual bit memory device stores two bits of data whereas a single bit memory device stores one bit of data. By storing two-bits in a single memory device, using the semiconductor fin and the triple gate structure, the memory device size is reduced and memory density is increased. The memory device has a lower device resistance and is simple to fabricate. It is also able to meet high temperature requirements. Better memory performance and faster speed are achieved.

BRIEF DESCRIPTION OF THE DRAWINGS

The disclosed embodiments will be better understood from a reading of the following detailed description, taken in conjunction with the accompanying drawings:

FIG. 3A is a cross-section view of a partially completed memory device, according to embodiments of the disclosure.

FIG. 3B is a cross-section view of a partially completed memory device after formation of a dielectric isolation material, according to embodiments of the disclosure.

FIG. 3C is a cross-section view of a partially completed memory device after removal of an upper portion of a conductive gate, according to embodiments of the disclosure.

FIG. 3D is a cross-section view of a partially completed memory device after removal of a center portion of the conductive gate and formation of a dielectric layer, according to embodiments of the disclosure.

FIG. 3E is a cross-section view of a memory device after formation of a third gate, according to embodiments of the disclosure.

FIG. 4 is a cross-section view of a memory device, according to further embodiments of the disclosure.

FIG. 5A is a cross-section view of a partially completed memory device, according to embodiments of the disclosure.

FIG. 6 is a cross-section view of a memory device, according to further embodiments of the disclosure.

FIG. 7A is a cross-section view of a partially completed memory device, according to embodiments of the disclosure.

FIG. 7B is a cross-section view of a partially completed memory device after formation of a dielectric isolation material, according to embodiments of the disclosure.

FIG. 7C is a cross-section view of a memory device, according to embodiments of the disclosure.

Figure 1A:
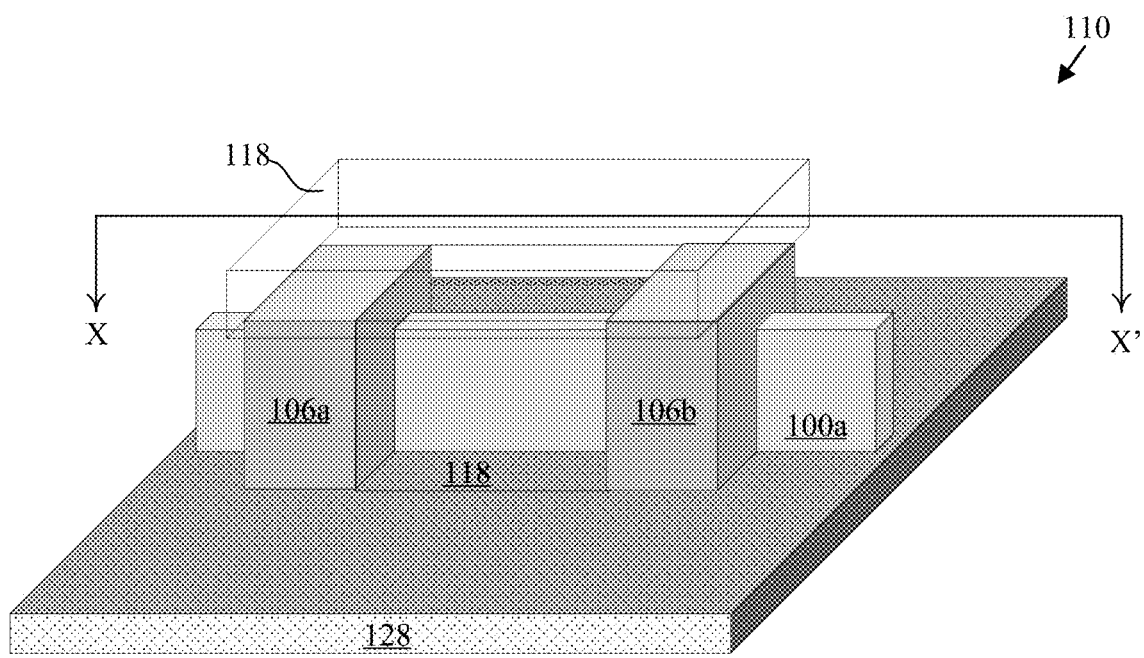
FIG. 1A is a perspective view of a memory device, according to embodiments of the disclosure.

For simplicity and clarity of illustration, the drawings illustrate the general manner of construction, and certain descriptions and details of well-known features and techniques may be omitted to avoid unnecessarily obscuring the discussion of the described embodiments of the device.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1A is a perspective view of a memory device 110, according to embodiments of the disclosure. In one embodiment, the memory device 110 is a Flash EEPROM memory device. Referring to FIG. 1A, the device 110 comprises a semiconductor fin 100a with a first gate 106a and a second gate 106b over the semiconductor fin 100a. A third gate 118 is positioned over the semiconductor fin 100a. The term "flash" when used with "EEPROM", generally refers to a device programmed by hot electron injection. The term "hot electrons" generally refers to electrons that have gained high kinetic energy after being accelerated by a strong electric field in areas of high field intensities.

In one embodiment, the third gate 118 may have an upper portion and a lower portion. The upper portion of the third gate 118 may be disposed over the first and second gates, 106a and 106b, respectively. The lower portion of the third gate 118 may be disposed between the first and second gates, 106a and 106b, respectively.

The third gate 118 of the memory device 110 may be made of a conductive material such as metal or any other suitable conductive materials. In some embodiments, the third gate 118 may be made of tungsten, aluminum, or any other suitable metals. The use of metal for the third gate 118 has numerous advantages including lower resistance, faster device speed and better erase performance.

The first and second gates, 106a and 106b, respectively, of the memory device 110 may be made of a conductive material such as doped polysilicon, metal or any other suitable conductive materials. In one embodiment, the polysilicon may be doped with phosphorus or arsenic. In some embodiments, the first and second gates, 106a and 106b, respectively, may be made of tungsten, aluminum, or any other suitable metals.

In one embodiment, the first and second gates, 106a and 106b, respectively, are floating gates. The term "floating gate" generally refers to a polysilicon gate surrounded by silicon dioxide. The floating gates may be used to store charges in the memory device 110. The third gate 118 may be a control gate. In one embodiment, the control gate may be used for programming and erasing.

The memory device 110 may include a dielectric layer 128. In one embodiment, a bottom portion of the semiconductor fin 100a is surrounded by the dielectric layer 128. The dielectric layer 128 may be shallow trench isolation (STI). In some embodiments, the first and second gates, 106a and 106b, respectively, are disposed over the dielectric layer 128. Bottom portions of the first and second gates, 106a and 106b, respectively, may be disposed over the dielectric layer 128. In some embodiments, the bottom portions of the third gate 118 may be disposed over the dielectric layer 128.

Figure 1B:
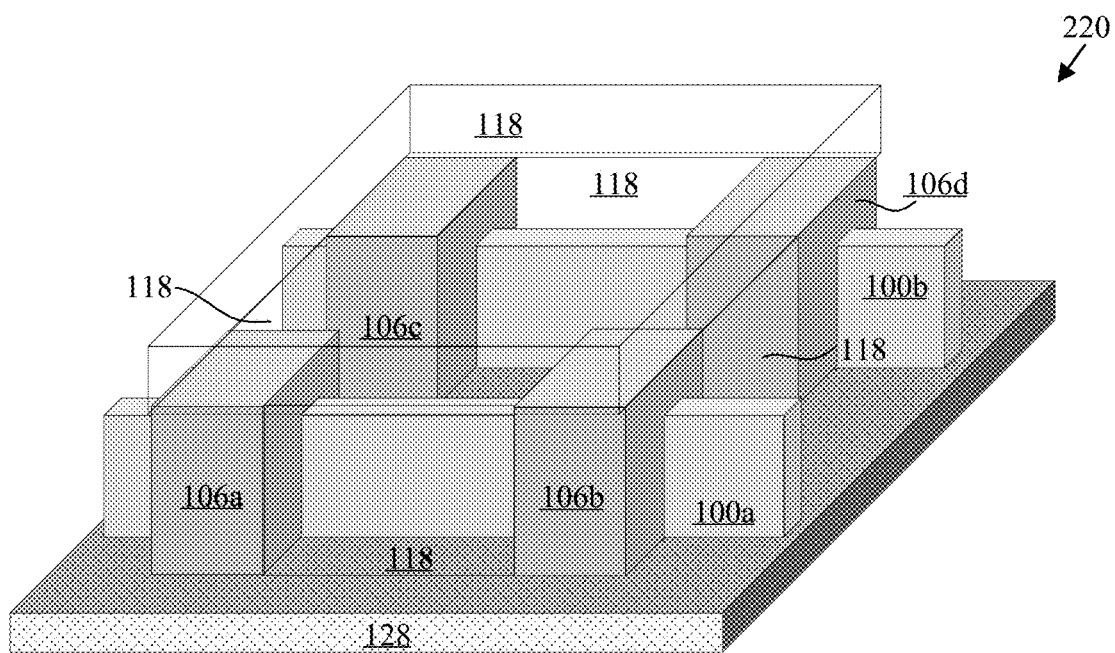
FIG. 1B is a perspective view of a memory device, according to further embodiments of the disclosure.

The embodiment illustrated in FIG. 1A may be modified to provide alternative embodiments within the scope of this disclosure. For example, FIG. 1B is a perspective view of a memory device 220, according to further embodiments of the disclosure. The same reference numerals used in FIG. 1A are also used in FIG. 1B to refer to identical features.

Referring to FIG. 1B, the memory device 220 includes a second semiconductor fin 100b. A fourth gate 106c and a fifth gate 106d are disposed over the second semiconductor fin 100b. The third gate 118 is disposed over the first and the second semiconductor fins, 100a and 100b, respectively. In one embodiment, the upper portion of the third gate 118 is disposed over the first, second, fourth and fifth gates, 106a, 106b, 106c and 106d, respectively. The lower portion of the third gate 118 may be disposed between the first, second, fourth and fifth gates, 106a, 106b, 106c and 106d, respectively.

The fourth and fifth gates, 106c and 106d, respectively, of the memory device 220 may be made of a conductive material such as doped polysilicon, metal or any other suitable conductive materials. In some embodiments, the fourth and fifth gates, 106c and 106d, respectively, may be made of tungsten, aluminum, or any other suitable metals. In some embodiments, the fourth and fifth gates, 106c and 106d, respectively, of the memory device 220 are floating gates.

Figure 1C:
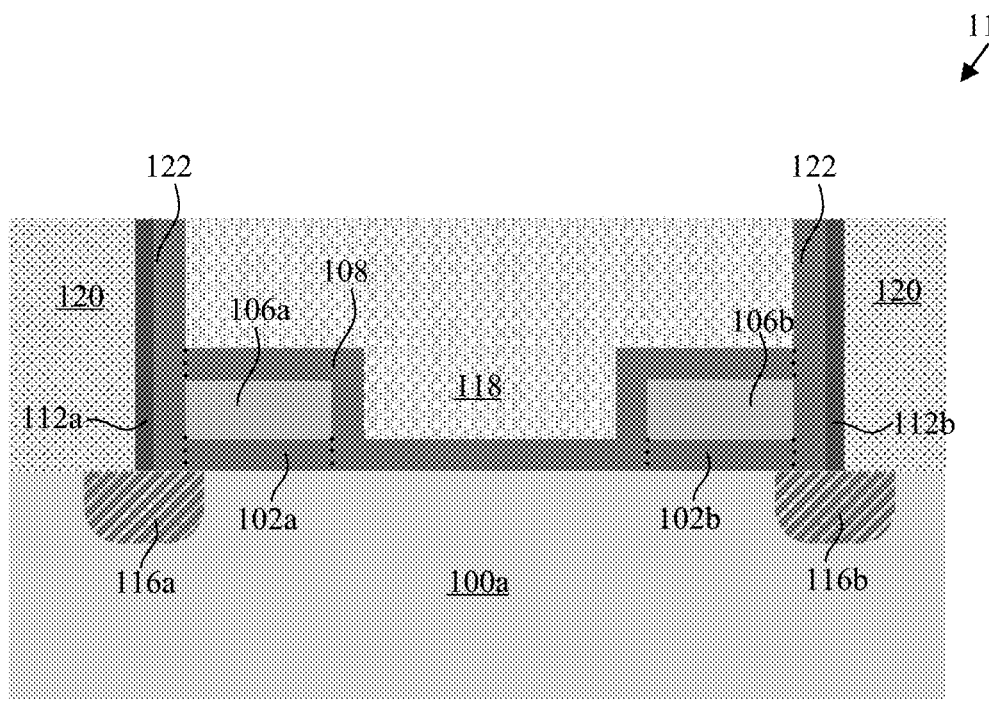
FIG. 1C is a cross-section view of a memory device taken along section line X-X' of FIG. 1A, according to embodiments of the disclosure.

FIG. 1C is a cross-section view of the memory device 110 taken along section line X-X' of FIG. 1A, according to embodiments of the disclosure. Referring to FIG. 1C, the memory device 110 may include a first doped semiconductor region 116a in the semiconductor fin 100a adjacent to the first gate 106a and a second doped semiconductor region 116b in the semiconductor fin 100a adjacent to the second gate 106b.

The memory device 110 may include dielectric layers 102a and 102b disposed over the semiconductor fin 100a. The dielectric layers 102a and 102b may collectively be referred to as dielectric layer 102. The dielectric layer 102 separates the first gate 106a and the second gate 106b from the semiconductor fin 100a.

The memory device 110 may include a dielectric layer 108 positioned over the first gate 106a, the second gate 106b and the semiconductor fin 100a. Interfaces between the dielectric layer 108 and the dielectric layer 102 are indicated by dashed lines. The dielectric layer 108 separates the first gate 106a and the second gate 106b from the third gate 118. The dielectric layer 108 separates the third gate 118 from the semiconductor fin 100a.

The memory device 110 may include dielectric material 122 arranged on the side surfaces of the first, second and third gates, 106a, 106b and 118, respectively. In an embodiment, dielectric spacers 112a and 112b are further formed on the side surfaces of the dielectric material 122 distant from the first, second and third gates, 106a, 106b and 118, respectively.

A dielectric isolation material 120 may be formed next to the dielectric spacers 112a and 112b. In one embodiment, the dielectric isolation material 120 is an interlayer dielectric (ILD) layer.

An exemplary set of biasing conditions for an embodiment of the memory device 110 is listed in Table 1 below. During a programming operation, for example for programming the first gate 106a, the third gate 118 of the memory device 110 is biased to 4V, the first doped semiconductor region 116a is biased between 5 to 8V and a current with a value of 1 µA is forced through the second doped semiconductor region 116b. The current is provided by a current source. The semiconductor fin 100a is grounded. These biasing conditions produce a strong, vertically oriented electric field in the semiconductor fin 100a between the third gate 118 and the first gate 106a, with electrons being delivered to edge portions of the first gate 106a by hot electron injection from the semiconductor fin 100a. This is sometimes referred to as source-side injection. As the first gate 106a becomes more negatively charged, a threshold voltage of the memory device 110 is increased. The first gate 106a holds one bit of data for the memory device 110.

TABLE 1

|  | first doped semiconductor region | second doped semiconductor region | third gate | semi-conductor fin |
|---|---|---|---|---|
| Program 1st gate | 5 to 8 V | 1 μA | 4 V | 0 V |
| Program 2nd gate | 1 μA | 5 to 8 V | 4 V | 0 V |
| Erase | 0 V | 0 V | 11 V | 0 V |
| Read | 0 V | 1 V | 2.5 V | 0 V |

During a programming operation for the second gate 106b, the biasing conditions for the first doped semiconductor region 116a and the second doped semiconductor region 116b is switched. The second doped semiconductor region 116b is biased between 5 to 8V and a current with a value of 1 μA is forced through the first doped semiconductor region 116a. The third gate 118 of the memory device 110 is biased to 4V and the semiconductor fin 100a is grounded. These biasing conditions produce a strong, vertically oriented electric field in the semiconductor fin 100a between the third gate 118 and the second gate 106b, with electrons being delivered to edge portions of the second gate 106b by hot electron injection from the semiconductor fin 100a. As the second gate 106b becomes more negatively charged, a threshold voltage of the memory device 110 is increased. The second gate 106b holds one bit of data for the memory device 110. Programming the first and second gates, 106a and 106b, respectively, results in storage of two bits of data in the memory device 110. The memory device 110 is a dual bit memory device.

In the erase mode, as illustrated in Table 1, the third gate 118 is biased to 11V while the first doped semiconductor region 116a, the second doped semiconductor region 116b and the semiconductor fin 100a are grounded. These biasing conditions create a strong electric field in the dielectric layer 108 between the first gate 106a and the third gate 118 and between the second gate 106b and the third gate 118. Electrons are ejected from the first gate 106a and the second gate 106b to the third gate 118. Both the first and second gates, 106a and 106b, are erased simultaneously. As both the first and second gates, 106a and 106b, respectively, become more positively charged the threshold voltage of the memory device 110 is reduced.

During a reading operation, the second doped semiconductor region 116b is biased to 1V and the third gate 118 is biased to 2.5V. The first doped semiconductor region 116a and the semiconductor fin 100a are grounded. A current will be detected at the second doped semiconductor region 116b depending on the threshold voltage of the memory device 110. For example, the threshold voltage of the memory device 110 is low after an erasing operation. A high amount of current will be detected at the second doped semiconductor region 116b. A low amount of current will be detected at the second doped semiconductor region 116b after programming the first and second gates, 106a and 106b, respectively due to a high threshold voltage of the memory device 110. An intermediate amount of current between the high current and the low current will be detected at the second doped semiconductor region after programming either the first gate 106a or the second gate 106b.

Figure 2:
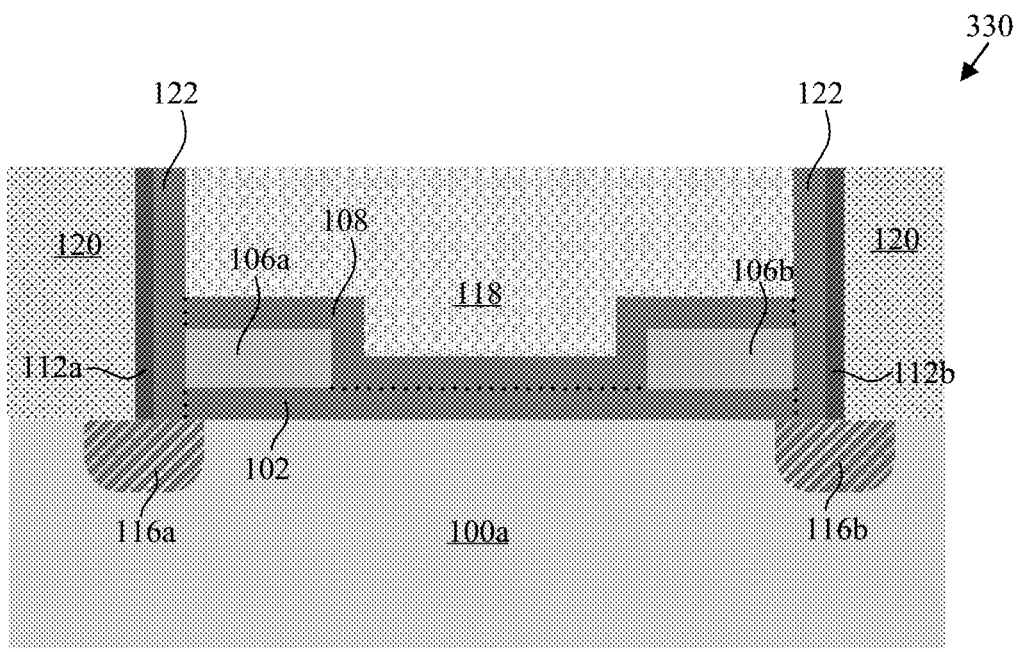
FIG. 2 is a cross-section view of a memory device, according to further embodiments of the disclosure.

FIG. 2 is a cross-section view of a memory device 330, according to further embodiments of the disclosure. The same reference numerals used in FIG. 1C are also used in FIG. 2 to refer to identical features. In contrast to the memory device 110 illustrated in FIG. 1C, the memory device 330 in FIG. 2 includes a dielectric layer 102 extending across a surface of the semiconductor fin 100a between the first and second gates 106a and 106b, respectively, with at least a center portion of the dielectric layer 108 positioned over at least a center portion of the dielectric layer 102 thereby separating the semiconductor fin 100a from the third gate 118.

The dielectric layer 108 of the memory device 330 is positioned over the first gate 106a, the second gate 106b and the dielectric layer 102. The dielectric layer 108 separates the first gate 106a and the second gate 106b from the third gate 118. The third gate 118 is separated from the semiconductor fin 100a by at least the center portions of the dielectric layers 108 and 102.

Several advantages are associated with the memory device 330 illustrated in FIG. 2. The third gate 118 is separated from the semiconductor fin 100a by dielectric layers 108 and 102. The memory device 330 has a high resistance to leakage or breakdown between the third gate 118 and the semiconductor fin 100a especially during an erase operation or erase mode. A high voltage is applied to the third gate 118 during an erase operation. Charge carriers or electrons are ejected from the first gate 106a and the second gate 106b to the third gate 118. The dielectric layers 108 and 102 prevent electrons from being injected into the third gate 118 from the semiconductor fin 100a.

FIGS. 3A to 3E illustrate a fabrication process flow for the memory device 110, according to embodiments of the disclosure. FIG. 3A is a cross-section view of a partially completed memory device 110, according to embodiments of the disclosure.

Referring to FIG. 3A, a conductive gate 106 disposed over a semiconductor fin 100a is provided. The conductive gate 106 is separated from the semiconductor fin 100a by a dielectric layer 102. The dielectric layer 102 may be made of silicon dioxide or any other suitable dielectric material. The conductive gate 106 may be made of doped polysilicon, metal or any other suitable conductive materials. In one embodiment, the polysilicon may be doped with phosphorus or arsenic. In some embodiments, the conductive gate 106 may be made of tungsten, aluminum, or any other suitable metals. The semiconductor fin 100a may be made of silicon, other elementary semiconductor material such as germanium, or a compound semiconductor. The compound semiconductor may include silicon carbide, gallium arsenide, indium arsenide, indium phosphide, another suitable compound semiconductor, or a combination thereof. In an embodiment, the semiconductor fin 100a is a p-type semiconductor.

A dielectric material 122 may be formed over side surfaces of the conductive gate 106 and the dielectric layer 102. Dashed lines indicate interfaces between the dielectric layer 102 and the dielectric material 122. The formation of the dielectric material 122 may be by a deposition process such as chemical vapor deposition (CVD), physical vapor deposition (PVD), atomic layer deposition (ALD) or any other suitable deposition process. Although not shown, the dielectric material 122 may be formed over a top surface of the conductive gate 106 and over a top surface of the semiconductor fin 100a. The dielectric material 122 may be made of silicon nitride, silicon carbide, silicon oxynitride, silicon oxycarbonitride, silicon oxycarbide, boron-doped silicon carbonitride (SiBCN) or any other suitable dielectric materials.

Dielectric spacers 112a and 112b may be formed over side surfaces of the dielectric material 122. The dielectric spacers 112a and 112b may be made of silicon nitride, silicon carbide, silicon oxynitride, silicon oxycarbonitride, silicon oxycarbide, boron-doped silicon carbonitride (SiBCN) or any other suitable dielectric materials. The formation of the dielectric spacers 112a and 112b may include a deposition process followed by etching, consistent with prior art practices. The deposition process may be by CVD, PVD, ALD or any other suitable deposition process. Although not shown, the etching process of the dielectric spacers 112a and 112b may also remove portions of the dielectric material 122 from the top surface of the conductive gate 106 and from the top surface of the semiconductor fin 100a.

A first doped semiconductor region 116a may be formed adjacent to the conductive gate 106. A second doped semiconductor region 116b may be formed adjacent to an opposite side of the conductive gate 106 from the first doped semiconductor region 116a. The first and second doped semiconductor regions, 116a and 116b, respectively, may be formed simultaneously. The formation of the first and second doped semiconductor regions, 116a and 116b, respectively, may include implantation of dopants followed by annealing, consistent with prior art practices. The dopants may include phosphorus, arsenic or any other suitable dopants.

FIG. 3B is a cross-section view of a partially completed memory device 110 after formation of a dielectric isolation material 120, according to embodiments of the disclosure. The dielectric isolation material 120 may be formed over side surfaces of the dielectric spacers 112a and 112b. The formation of the dielectric isolation material 120 may include a deposition process followed by a planarization process, consistent with prior art practices. The deposition process may be by CVD, PVD, ALD or any other suitable process. The planarization process may be by chemical mechanical planarization (CMP). The dielectric isolation material 120 may be made of silicon dioxide, silicon oxynitride, borosilicate glass, phosphoric silicate glass, fluorinated silicate glass, another suitable material or a combination thereof.

FIG. 3C is a cross-section view of a partially completed memory device 110 after removal of an upper portion of the conductive gate 106, according to embodiments of the disclosure. The removal process may be by a wet etch or dry etch process. The removal of the upper portion of the conductive gate 106 leaves behind a lower portion of the conductive gate 106 over the dielectric layer 102 thereby forming a gate opening.

FIG. 3D is a cross-section view of a partially completed memory device 110 after removal of at least a center portion of the conductive gate 106 and formation of a dielectric layer 108, according to embodiments of the disclosure. The removal of the center portion of the conductive gate 106 leaves behind side portions of the conductive gate 106 thereby forming the first gate 106a and the second gate 106b over the semiconductor fin 100a. In an embodiment, the removal of the center portion of the conductive gate 106 may include removing at least a center portion of the dielectric layer 102 thereby leaving behind side portions of the dielectric layer 102. The side portions of the dielectric layer 102 may be referred to as dielectric layer 102a and 102b.

The removal of the center portion of the conductive gate 106 may include a photolithography process followed by an etching process. The photolithography process includes depositing a layer of photoresist material over the conductive gate 106 followed by conventional exposure and developing to form photoresist patterns. The portions of the conductive gate 106 not covered by the photoresist patterns may be removed by a wet etch or dry etch process. Although not shown, the layer of photoresist material may subsequently be removed.

The dielectric layer 108 may be formed over the first gate 106a, the second gate 106b and the semiconductor fin 100a. The formation of the dielectric layer 108 may be by a suitable deposition process such as CVD, PVD, ALD or any other suitable deposition process. The dielectric layer 108 may be made of silicon dioxide or any other suitable dielectric material.

FIG. 3E is a cross-section view of a memory device 110 after formation of a third gate 118, according to embodiments of the disclosure. The third gate 118 may be formed over the first gate 106a, the second gate 106b and the semiconductor fin 100a. The third gate 118 may be separated from the first gate 106a, the second gate 106b and the semiconductor fin 100a by the dielectric layer 108. The formation of the third gate 118 may include depositing a layer of suitable conductive material over the dielectric layer 108 thereby filling up the gate opening. Although not shown, a portion of the layer of conductive material may also be deposited over a top surface of the dielectric isolation material 120. The deposition process may be by CVD, PVD, ALD or any other suitable deposition process. A planarization process such as CMP may subsequently be used to remove portions of the conductive material from the top surface of the dielectric isolation material 120 thereby leaving behind a portion of the conductive material in the gate opening to form the third gate 118. The conductive material may be made of tungsten, aluminum, or any other suitable metals.

FIG. 4 is a cross-section view of a memory device 440, according to further embodiments of the disclosure. The same reference numerals used in FIG. 1C are also used in FIG. 4 to refer to identical features. Compared to the memory devices 110 and 330 illustrated in FIG. 1C and FIG. 2, respectively, and the memory device 220 illustrated in FIG. 1B, the memory device 440 includes a third gate 218 having an upper portion disposed between a first gate 206a and a second gate 206b. The third gate 218 may be made of a conductive material such as metal or any other suitable conductive materials. In an embodiment, the third gate 218 may be made of tungsten, aluminum, or any other suitable metals. The first and second gates, 206a and 206b, respectively, of the memory device 440 may be made of a conductive material such as doped polysilicon, metal or any other suitable conductive materials. In some embodiments, the first and second gates, 206a and 206b, may be made of tungsten, aluminum, or any other suitable metals. In some embodiments, the first and second gates, 206a and 206b, respectively, of the memory device 440 are floating gates. In some embodiments, the third gate 218 is a control gate.

Referring to FIG. 4, the memory device 440 includes the semiconductor fin 100a. The first gate 206a and the second gate 206b are disposed over the semiconductor fin 100a. The third gate 218 is disposed over the semiconductor fin 100a and is between the first gate 206a and the second gate 206b. The dielectric layers 102a and 102b are disposed over the semiconductor fin 100a. The dielectric layers 102a and 102b may collectively be referred to as the dielectric layer 102. The dielectric layer 102 separates the first gate 206a and the second gate 206b from the semiconductor fin 100a. The dielectric layer 108 is positioned over at least a side surface of the first gate 206a and the second gate 206b and over the semiconductor fin 100a. Interfaces between the dielectric layer 108 and the dielectric layer 102 are indicated by dashed lines. The dielectric layer 108 separates the first gate 206a and the second gate 206b from the third gate 218, and the third gate 218 from the semiconductor fin 100a.

Figure 5B:
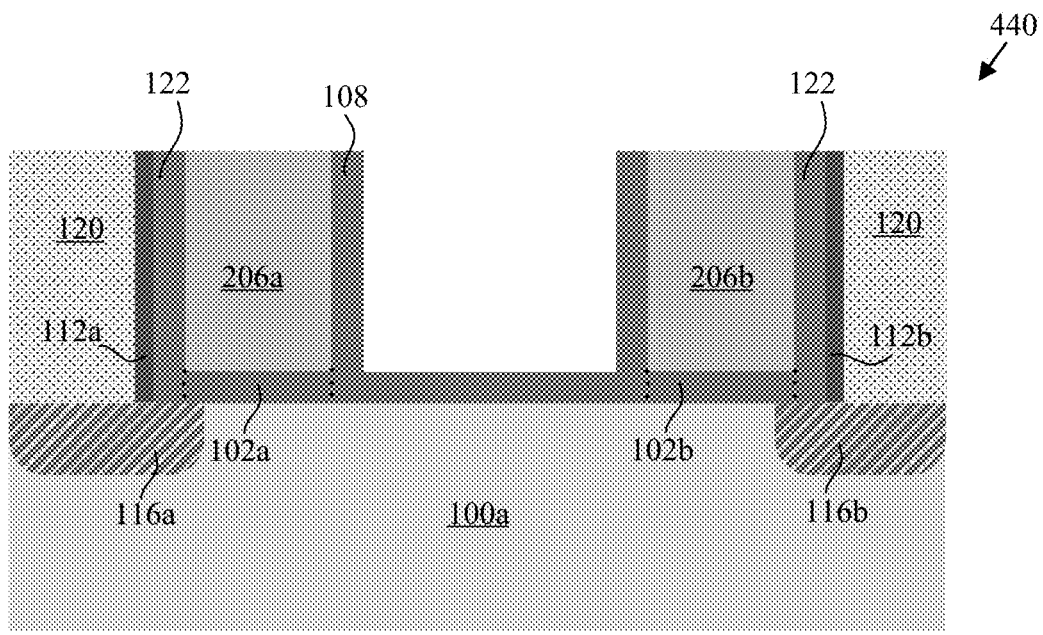
FIG. 5B is a cross-section view of a partially completed memory device after removal of a center portion of the conductive gate and formation of the dielectric layer, according to embodiments of the disclosure.
Figure 5C:
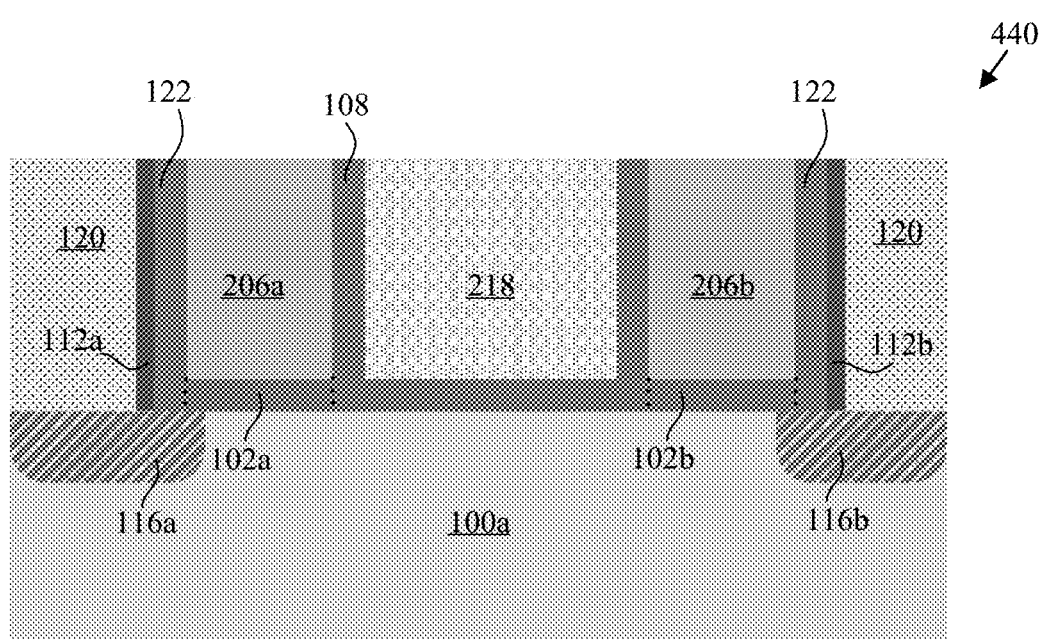
FIG. 5C is a cross-section view of a memory device, according to embodiments of the disclosure.

FIGS. 5A to 5C illustrate a fabrication process flow for the memory device 440, according to embodiments of the disclosure. The fabrication process flow for the memory device 440 is similar to the fabrication process flow for the memory device 110 shown in FIGS. 3A and 3B. FIG. 3B is reproduced as FIG. 5A.

FIG. 5A is a cross-section view of a partially completed memory device 440, according to embodiments of the disclosure. Referring to FIG. 5A, the conductive gate 106 disposed over the semiconductor fin 100a is provided. The conductive gate 106 is separated from the semiconductor fin 100a by the dielectric layer 102. The dielectric material 122 may be formed over side surfaces of the conductive gate 106 and the dielectric layer 102. Dashed lines indicate interfaces between the dielectric layer 102 and the dielectric material 122. The dielectric spacers 112a and 112b may be formed over side surfaces of the dielectric material 122. The first doped semiconductor region 116a may be formed adjacent to the conductive gate 106. The second doped semiconductor region 116b may be formed adjacent to an opposite side of the conductive gate 106 from the first doped semiconductor region 116a. The first and second doped semiconductor regions, 116a and 116b, respectively, may be formed simultaneously. The dielectric isolation material 120 may be formed over side surfaces of the dielectric spacers 112a and 112b.

FIG. 5B is a cross-section view of a partially completed memory device 440 after removal of at least a center portion of the conductive gate 106 and formation of the dielectric layer 108, according to embodiments of the disclosure. Referring to FIG. 5B, the removal of at least the center portion of the conductive gate 106 may leave behind at least side portions of the conductive gate 106 thereby forming the first and second gates, 206a and 206b, respectively. The removal of at least the center portion of the conductive gate 106 forms a gate opening separating the first and second gates, 206a and 206b, respectively. The dielectric layer 108 may be formed over side surfaces of the first and second gates, 206a and 206b, respectively and over the semiconductor fin 100a.

FIG. 5C is a cross-section view of a memory device 440, according to embodiments of the disclosure. FIG. 4 is reproduced as FIG. 5C. Referring to FIG. 5C, the third gate 218 may be formed between the first gate 206a and the second gate 206b. The formation of the third gate 218 may include depositing a layer of suitable conductive material over the dielectric layer 108 thereby filling up the gate opening between the first gate 206a and the second gate 206b. Although not shown, a portion of the layer of conductive material may also be deposited over top surfaces of the first and second gates, 206a and 206b, respectively and over the dielectric isolation material 120. A planarization process may subsequently be used to remove portions of the conductive material from the top surfaces of the first gate 206a and the second gate 206b and from the dielectric isolation material 120, thereby leaving behind a portion of the conductive material in the gate opening to form the third gate 218. Advantages associated with the memory device 440 illustrated in FIG. 5C include a simple fabrication process flow.

FIG. 6 is a cross-section view of a memory device 550, according to further embodiments of the disclosure. The same reference numerals used in FIG. 1C are also used in FIG. 6 to refer to identical features. In contrast to the memory devices 110, 220, 330 and 440 illustrated in FIGS. 1C, 1B, 2 and 4, respectively, the memory device 550 includes a dielectric material 332 separating a third gate 318 from the first and second gates, 106a and 106b, respectively. The dielectric material 332 may be a dielectric isolation material. In an embodiment, the dielectric material 332 may be an ILD layer. The third gate 318 may be made of a suitable metal including tungsten, aluminum, or any other suitable metal.

Referring to FIG. 6, the memory device 550 includes the semiconductor fin 100a with the first gate 106a and the second gate 106b disposed over the semiconductor fin 100a. The third gate 318 is disposed over the semiconductor fin 100a and a lower portion of the third gate 318 is between the first gate 106a and the second gate 106b. The dielectric layer 108 is disposed over the first gate 106a, the second gate 106b and the semiconductor fin 100a. The third gate 318 is separated from the semiconductor fin 100a by the dielectric layer 108. The dielectric material 332 is disposed over the first gate 106a, the second gate 106b and over side surfaces of the third gate 318. The third gate 318 is separated from the first gate 106a and the second gate 106b by the dielectric material 332 and the dielectric layer 108.

FIGS. 7A to 7C illustrate a fabrication process flow for the memory device 550 illustrated in FIG. 6. The fabrication process flow for the memory device 550 is similar to the fabrication process flow for the memory device 110 illustrated in FIGS. 3A to 3D. FIG. 3D is reproduced as FIG. 7A.

FIG. 7A is a cross-section view of a partially completed memory device 550, according to embodiments of the disclosure. Referring to FIG. 7A, the semiconductor fin 100a is provided. The first gate 106a and the second gate 106b are formed over the semiconductor fin 100a. The dielectric layer 108 is formed over the first gate 106a, the second gate 106b and the semiconductor fin 100a.

FIG. 7B is a cross-section view of a partially completed memory device 550 after formation of the dielectric isolation material 332, according to embodiments of the disclosure. Referring to FIG. 7B, the dielectric isolation material 332 may be deposited over the dielectric material 108. The deposition process may be by CVD, PVD, ALD or any other suitable deposition processes. At least a center portion of the dielectric isolation material 332 may be removed from at least a center portion of the dielectric layer 108 thereby forming an opening separating the first gate 106a and the second gate 106b. The removal of at least the center portion of the dielectric isolation material 332 may include photolithography and etching processes, consistent with prior art practices. The photolithography process includes depositing a layer of photoresist material over the dielectric isolation material 332 followed by conventional exposure and developing to form photoresist patterns. A wet etch or dry etch process may be used to remove portions of the dielectric isolation material 332 not covered by the photoresist patterns. Although not shown, the layer of photoresist material may subsequently be removed.

FIG. 7C is a cross-section view of a memory device 550, according to embodiments of the disclosure. Referring to FIG. 7C, the third gate 318 may be formed between the first gate 106a and the second gate 106b. The formation of the third gate 318 may include depositing a layer of suitable metal thereby filling up the opening between the first gate 106a and the second gate 106b. Although not shown, a portion of the metal layer may be deposited over top surfaces of the dielectric isolation material 332 and the dielectric isolation material 120. A planarization process may be used to remove the portion of the metal layer from the top surfaces of the dielectric isolation material 332 and the dielectric isolation material 120 thereby leaving behind a portion of the metal layer in the opening between the first gate 106a and the second gate 106b to form the third gate 318. Similar to the memory device 440 illustrated in FIG. 5C, advantages associated with the memory device 550 shown in FIG. 7C include a simple fabrication process flow.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A memory device comprising:
   a semiconductor fin;
   a first gate and a second gate over the semiconductor fin;
   a first doped semiconductor region in the semiconductor fin adjacent to the first gate and spaced from the second gate;
   a second doped semiconductor region in the semiconductor fin adjacent to the second gate and spaced from the first gate; and
   a third gate positioned over the semiconductor fin, wherein a lower portion of the third gate is between the first and second gates.

2. The memory device of claim 1, further comprising:
   the third gate having an upper portion; and
   wherein the upper portion is disposed over the first and second gates.

3. The memory device of claim 2, further comprising:
   a second semiconductor fin;
   a fourth gate and a fifth gate over the second semiconductor fin;
   wherein the third gate is positioned over the second semiconductor fin;
   wherein the upper portion of the third gate is disposed over the fourth and fifth gates; and
   wherein the lower portion of the third gate is between the fourth and fifth gates.

4. The memory device of claim 3, wherein the lower portion of the third gate is between the first, second, fourth and fifth gates.

5. The memory device of claim 1, wherein the third gate is made of a conductive material comprising tungsten, aluminum, or its combinations.

6. The memory device of claim 1, wherein the first and second gates are made of a conductive material comprising polysilicon, metal, or its combinations.

7. The memory device of claim 3, wherein the fourth and fifth gates are made of a conductive material comprising polysilicon, metal, or its combinations.

8. The memory device of claim 1, wherein the first gate and the second gate are floating gates; and
   wherein the third gate is a control gate.

9. The memory device of claim 3, wherein the fourth and fifth gates are floating gates.

10. The memory device of claim 2, further comprising:
    a first dielectric layer disposed over the semiconductor fin, wherein the first dielectric layer separates the first and second gates from the semiconductor fin;
    a second dielectric layer is positioned over the first gate, the second gate and the semiconductor fin;
    wherein the second dielectric layer separates the first gate and the second gate from the third gate; and
    wherein the second dielectric layer separates the third gate from the semiconductor fin.

11. The memory device of claim 2, further comprising:
    a first dielectric layer disposed over the semiconductor fin, wherein the first dielectric layer separates the first and second gates from the semiconductor fin;
    a second dielectric layer is positioned over the first gate, the second gate and the first dielectric layer;
    wherein the second dielectric layer separates the first gate and the second gate from the third gate; and
    wherein the first and second dielectric layers separate the third gate from the semiconductor fin.

12. A memory device comprising:
    a dielectric layer;
    a semiconductor fin, wherein a bottom portion of the semiconductor fin is surrounded by the dielectric layer;
    a first gate and a second gate over the semiconductor fin;
    a first doped semiconductor region in the semiconductor fin adjacent to the first gate and spaced from the second gate;

a second doped semiconductor region in the semiconductor fin adjacent to the second gate and spaced from the first gate; and a third gate positioned over the semiconductor fin, wherein a lower portion of the third gate is between the first and second gates.

13. The memory device of claim 12, further comprising: dielectric spacers disposed over side surfaces of the first, second and third gates.

14. The memory device of claim 13, further comprising: a dielectric isolation material disposed over side surfaces of the dielectric spacers.

15. The memory device of claim 14, further comprising: a dielectric material separating the dielectric spacers from the first, second and third gates.

16. The memory device of claim 12, wherein a dielectric isolation material separates the third gate from the first and second gates.

17. The memory device of claim 15, wherein the dielectric material directly contacts the third gate.

18. The memory device of claim 15, wherein the dielectric isolation material is spaced from the dielectric material.

19. A method of fabricating a memory device comprising:

providing a semiconductor fin and a conductive gate arranged over the semiconductor fin;

forming a first doped semiconductor region in the semiconductor fin adjacent to the conductive gate and a second doped semiconductor region in the semiconductor fin adjacent to an opposite side of the conductive gate from the first doped semiconductor region;

patterning the conductive gate to form a first gate and a second gate over the semiconductor fin, wherein the first doped semiconductor region is adjacent to the first gate and spaced from the second gate, and the second doped semiconductor region is adjacent to the second gate and spaced from the first gate; and forming a third gate over the semiconductor fin, wherein a lower portion of the third gate is between the first and second gates.

20. The method of claim 19, further comprising:

forming dielectric spacers over side surfaces of the conductive gate; and forming a dielectric isolation material over side surfaces of the dielectric spacers.

* * * * *